(12) United States Patent
Fukuda et al.

(10) Patent No.: US 7,880,173 B2
(45) Date of Patent: Feb. 1, 2011

(54) SEMICONDUCTOR DEVICE AND METHOD OF MANUFACTURING SAME

(75) Inventors: Kenji Fukuda, Tsukuba (JP); Junji Senzaki, Tsukuba (JP); Shinsuke Harada, Tsukuba (JP); Makoto Kato, Tsukuba (JP); Tsutomu Yatsuo, Tsukuba (JP); Mitsuo Okamoto, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 431 days.

(21) Appl. No.: 12/025,445

(22) Filed: Feb. 4, 2008

(65) Prior Publication Data

US 2008/0203400 A1    Aug. 28, 2008

Related U.S. Application Data

(63) Continuation-in-part of application No. 10/517,772, filed as application No. PCT/JP03/08146 on Jun. 26, 2003, now Pat. No. 7,338,869.

(30) Foreign Application Priority Data

Jun. 28, 2002    (JP) .............................. 2002-189161

(51) Int. Cl.
*H01L 29/15* (2006.01)
(52) U.S. Cl. ........................... 257/77; 257/66; 257/336; 257/411; 257/E21.054; 438/231
(58) Field of Classification Search ............... None
See application file for complete search history.

(56) References Cited

U.S. PATENT DOCUMENTS 4,637,124 A * 1/1987 Okuyama et al. ........... 438/231

(Continued)

FOREIGN PATENT DOCUMENTS

EP    1 434 272 A1    6/2004

(Continued)

OTHER PUBLICATIONS

Fukuda et al., Applied Physics Letters vol. 77 (2000), p. 866.*

(Continued)

*Primary Examiner*—Evan Pert
*Assistant Examiner*—Scott Wilson
(74) *Attorney, Agent, or Firm*—Oblon, Spivak, McClelland, Maier & Neustadt, L.L.P.

(57) ABSTRACT

A semiconductor device and a method of manufacturing the device using a (000-1)-faced silicon carbide substrate are provided. A SiC semiconductor device having a high blocking voltage and high channel mobility is manufactured by optimizing the heat-treatment method used following the gate oxidation. The method of manufacturing a semiconductor device includes the steps of forming a gate insulation layer on a semiconductor region formed of silicon carbide having a (000-1) face orientation, forming a gate electrode on the gate insulation layer, forming an electrode on the semiconductor region, cleaning the semiconductor region surface. The gate insulation layer is formed in an atmosphere containing 1% or more $H_2O$ (water) vapor at a temperature of from 800° C. to 1150° C. to reduce the interface trap density of the interface between the gate insulation layer and the semiconductor region.

8 Claims, 12 Drawing Sheets

U.S. PATENT DOCUMENTS

| | | | |
|---|---|---|---|
| 4,639,761 A * | 1/1987 | Singer et al. | 257/336 |
| 5,763,904 A * | 6/1998 | Nakajima et al. | 257/66 |
| 2003/0013266 A1 | 1/2003 | Fukuda et al. | |
| 2004/0094811 A1* | 5/2004 | Takagi | 257/411 |
| 2008/0203400 A1* | 8/2008 | Fukuda et al. | 257/77 |

FOREIGN PATENT DOCUMENTS

| | | |
|---|---|---|
| JP | 9-199497 | 7/1997 |
| JP | 09-199497 | 7/1997 |
| JP | 10-50701 | 2/1998 |
| JP | 10-112460 | 4/1998 |
| JP | 11-031691 | 2/1999 |
| JP | 11-31691 | 2/1999 |
| JP | 11-74263 | 3/1999 |
| JP | 11-297712 | 10/1999 |
| JP | 2000-252461 | 9/2000 |
| WO | 00/13236 | 3/2000 |

OTHER PUBLICATIONS

Ogino, Shinji et al. "Channel Doped SiC-MOSFETs", Materials Science Forum, vols. 338-342, pp. 1101-1104 2000.

Fukuda, K. et al. "Effect of oxidation method and post-oxidation annealing on interface properties of metal-oxide-semiconductor structures formed on n-type 4H-SiC C(0001) face", Applied Physics Letters, vol. 77, No. 6, pp. 866-868 2000.

* cited by examiner

FIG.1
(a)
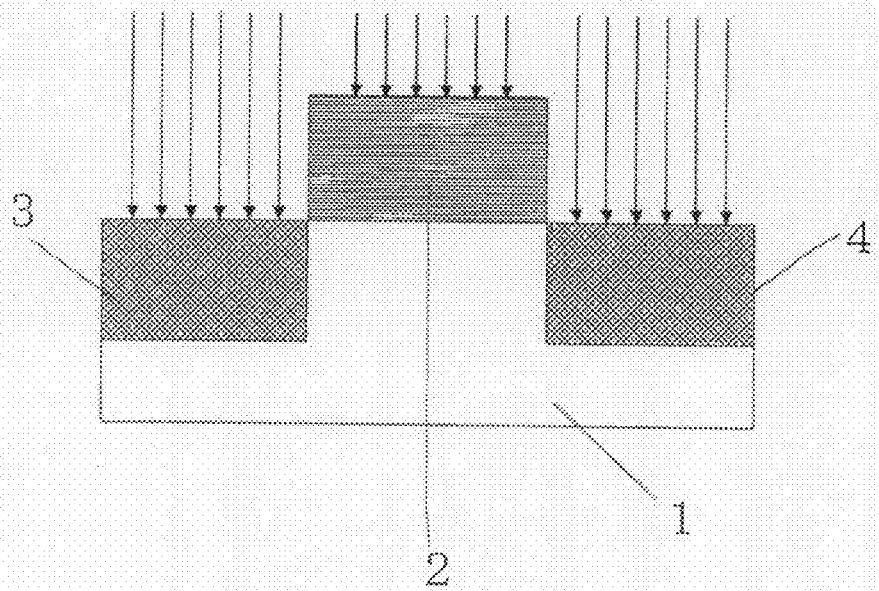
(b)
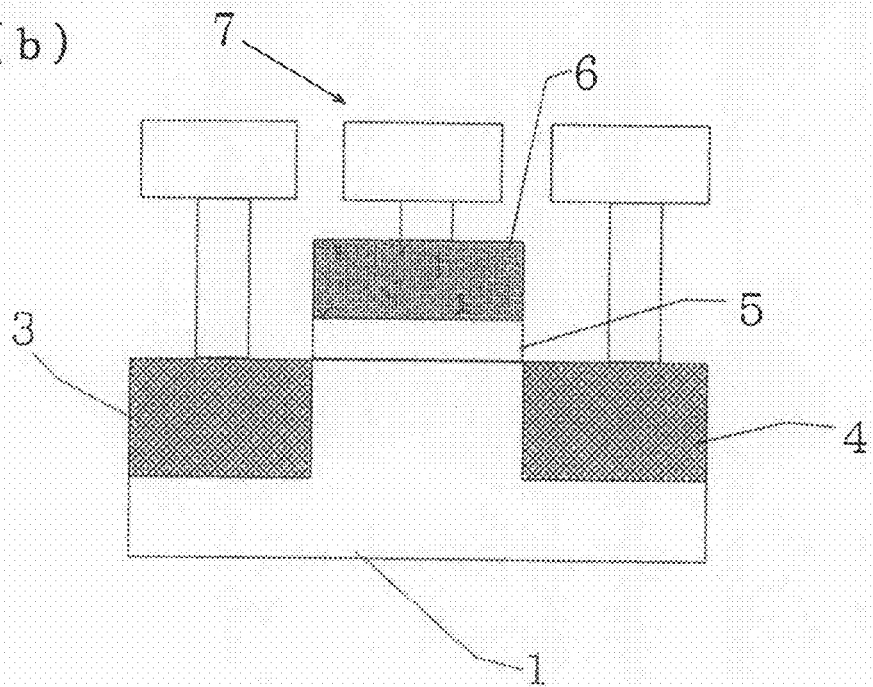

SEMICONDUCTOR DEVICE AND METHOD OF MANUFACTURING SAME

CROSS REFERENCE TO RELATED APPLICATION(S)

This application is a continuation-in-part and claims the benefit of priority under 35 U.S.C. §120 from U.S. application Ser. No. 10/517,772, filed Jul. 12, 2005, which is the national stage of PCT/JP03/08146, filed Jun. 26, 2003 and claims the benefit of priority under 35 U.S.C. §119 of Japanese Patent Application No. 2002-189161, filed on Jun. 28, 2002. The entire contents of these applications are incorporated herein by reference.

FIELD OF THE INVENTION

The present invention relates to a semiconductor device and to a method of manufacturing the semiconductor device on a silicon carbide substrate having a prescribed crystal plane orientation. It particularly relates to a semiconductor device that uses a gate insulation layer, such as those of a metal-oxide-semiconductor (MOS) capacitor or a MOS field-effect transistor (MOSFET), and to a method of manufacturing the semiconductor device.

BACKGROUND ART

The interface trap density of an oxide layer-silicon carbide interface using a silicon carbide (SiC) substrate is some ten times higher than that of a silicon MOS transistor. This gives rise to the problem that a silicon carbide substrate-based MOSFET has about one-tenth the channel mobility of a silicon substrate-based MOSFET. Although a bulk SiC substrate having the crystal structure referred to as 4H—SiC has about twice the channel mobility of a bulk SiC substrate having the crystal structure referred to as 6H—SiC, an oxide layer/silicon carbide interface has a high number of defects (interface trap density) and, therefore, has lower channel mobility. It should be possible to utilize the higher channel mobility of a bulk 4H—SiC substrate to reduce the On-resistance of a power MOSFET. However, because of the low channel mobility, the On-resistance of 4H—SiC is higher than that of 6H—SiC, so reducing the interface trap density of the 4H—SiC MOS structure is critically important for realizing a SiC MOSFET. Typically, SiC has a (0001) face, a (11-20) face and a (000-1) face. The oxidation rate in the case of the (11-20) face is some ten times higher than that of the (0001) face, and that of the (000-1) face is higher still. This is because the oxidation mechanism of Si and C differs depending on the plane orientation. Since, therefore, the optimum oxidation conditions and post-oxidation annealing conditions for decreasing the interface trap density at the oxidation layer/silicon carbide interface also differ depending on the plane orientation, it is necessary to optimize oxidation conditions and post-oxidation annealing conditions for each plane orientation. In the initial research, SiC MOSFETs were formed on the (0001) face, but the channel mobility of such devices was no higher than 10 $cm^2/Vs$.

The recent literature describes channel mobility being improved to up to 110 $cm^2/Vs$ by reducing the interface trap density by using $H_2O$ (water) to form a gate insulation layer on the (11-20) face of SiC and then subjecting the layer to hydrogen annealing. However, the (11-20) face has lower dielectric breakdown field strength than the (0001) or (000-1) face, and is therefore disadvantageous for high blocking voltage power devices. Also, there are no reports of MOSFETs fabricated on the (000-1) face operating without the use of channel doping technology. The channel doping technology is not suitable for high blocking voltage power devices, because although it improves channel mobility, leakage current flows more readily and blocking voltage decreases. The present invention provides a technology for forming on a (000-1) face having a higher dielectric breakdown voltage than a (11-20) face, an oxide layer/silicon carbide interface having higher channel mobility than a (0001) face.

With respect to the method of oxidizing the silicon carbide substrate and the subsequent heat-treatment method, there have already been a number of announcements and patent disclosures, described below.

JP-A HEI 9-199497, for example, discloses a method of improving a thermal oxidation layer of a SiC single crystal substrate by following the oxidation step with an annealing step using hydrogen and an annealing step using inert gas to reduce hysteresis and flat band-shift. In particular, this publication describes a method in which the silicon carbide oxidation is followed by hydrogen annealing at 1000° C. This method relates to the (0001) face of a silicon carbide substrate, and does not describe anything relating to the (000-1) face. Moreover, a temperature of 1000° C. is too high, with the oxidation layer being reduced by the hydrogen, degrading the reliability of a device in which the oxidation layer is used as a gate layer.

JP-A HEI 10-112460 discloses a silicon carbide semiconductor device fabrication method in which, in order to reduce the interface trap density, a thermal oxidation layer is formed, subjected to less than two hours of annealing in an inert gas atmosphere, and then heat-treated at a low temperature in the range 300° C. to 500° C. in hydrogen or a gas containing hydrogen atoms such as in the form of water vapor. This is then followed by a cooling period, at least part of which takes place in a gaseous atmosphere containing hydrogen atoms. So, the disclosure describes a method in which the gate oxidation layer is formed and heat-treated at 300° C. to 500° C. in an atmosphere containing hydrogen atoms, but the method relates to the (0001) face of a silicon carbide substrate and teaches nothing relating to the (000-1) face. Also, the heat treatment temperature within the range 300° C. to 500° C. is too low for adequate heat-treatment.

JP-A HEI 11-31691 discloses a method of forming a thermal oxidation layer in a SiC semiconductor device in which the interface trap density following layer formation is reduced by, in a method of forming a thermal oxidation layer in which the layer is grown by a pyrogenic oxidation process by introducing hydrogen and oxygen, (1) using a hydrogen-oxygen mixture in which there is more hydrogen than oxygen, or (2) after oxidation, cooling in an atmosphere containing hydrogen atoms and using a cooling rate within the range 0.3 to 3° C./min, or (3) following oxidation and cooling, using an extraction temperature of not more than 900° C. While the disclosure does describe a method of cooling in an atmosphere containing hydrogen after the pyrogenic oxidation, the method relates to the (0001) face of a SiC substrate, and does not relate to the (000-1) face. Also, the described mixture ratio of hydrogen and oxygen used in the pyrogenic method is not optimal.

JP-A 2000-252461 describes a semiconductor device fabrication method in which one, two or more oxide and/or nitride gate insulation layers are formed on at least the topmost layer of a silicon carbide substrate and are then annealed at 600° C. to 1600° C. in an atmosphere that contains hydrogen. In this method, a good gate insulation layer/silicon carbide interface able to adequately stand up to actual use can be obtained by using hydrogen to terminate silicon or carbon tangling bonds that exist in the interface to thereby adequately reduce the interface trap density. While the disclosure describes the use of heat treatment in hydrogen after forming the oxide layer on the silicon carbide substrate, the method relates to the (0001) face of a SiC substrate and has no disclosure of a desirable hydrogen heat treatment method with respect to the (0001) face.

U.S. Pat. No. 5,972,801 discloses a method for obtaining improved oxide layers and resulting improved performance from oxide-based devices. The method reduces defects in an oxide layer on a silicon carbide substrate by using a process in which the oxide layer is exposed to an oxidizing atmosphere at a temperature that is below the temperature at which silicon carbide would oxidize while high enough to enable the oxidizing source gas to diffuse in the oxide, and for a time that is not long enough to cause additional oxidation of the silicon carbide substrate but is sufficient to densify the oxide layer and improve the characteristics of the interface between the oxide layer and the substrate. The method describes treating the formed gate oxide layer at 600° C. to 1000° C. in an atmosphere containing water vapor, but this water vapor is produced not by the reaction of $H_2$ gas and $O_2$ gas, but by heating pure water. Moreover, the method as described does not relate to formation of a gate oxide layer on the (000-1) face followed by heat-treatment of the layer.

With respect to the (000-1) face of 6H—SiC, in Materials Science Forum, Vols. 338-842 (2000), p. 1101, S. Ogino, T. Oikawa and K. Ueno reported on the operation of a MOSFET formed using channel doping in which the dopant was implanted below the gate oxide layer, but did not report on results in cases in which channel doping was not used. Also, the report only described forming a gate oxide layer by dry oxidation in which the layer is dried in oxygen at 1100° C.

In Applied Physics Letters Vol. 77 (2000), p. 866, K Fukuda, W. J. Cho, K. Arai, S. Suzuki, J. Senzaki and T. Tanaka reported, with respect to the relationship between interface trap density and a method of forming a gate oxide layer on the (000-1) face of 4H—SiC by thermal oxidation at 1200° C. However, they did not report on a method of forming a gate insulation layer at a temperature below 1200° C. and on the post-oxidation treatment.

As described in the foregoing, typically SiC has three faces: a (0001) face, a (11-20) face and a (000-1) face. The oxidation rate of the (11-20) face is higher than that of the (0001) face, and that of the (000-1) face is higher still. Specifically, the oxidation rate of the (000-1) face is some ten times higher than that of the (0001) face. Therefore, the optimum oxidation conditions and post-oxidation annealing conditions for decreasing the interface trap density at the oxidation layer/silicon carbide interface also differ from face to face. For example, in the case of the (0001) face, the interface trap density is lower when dry oxygen is used compared with when $H_2O$ is used, but in the case of the (11-20) face, the interface trap density is lower when $H_2O$ is used. The post-oxidation annealing effect also differs from face to face. Thus, the oxidation conditions and post-oxidation annealing conditions for minimizing the interface trap density have to be optimized for each face. In the initial research, SiC MOSFETs were formed on the (0001) face, but the channel mobility of such devices was no higher than 10 $cm^2/Vs$. Recent reports describe channel mobility being improved to up to 110 $cm^2/Vs$ by reducing the interface trap density by using water to form a gate insulation layer on the (11-20) face of the SiC. However, the (11-20) face has lower dielectric breakdown field strength than the (0001) or (000-1) face, and is therefore disadvantageous for high blocking voltage power devices. Also, there are no reports of MOSFETs fabricated on the (000-1) face operating without the use of channel doping technology. Channel doping is not suitable for high blocking voltage power devices, because although it improves channel mobility, it causes leakage current to flow more readily, so blocking voltage decreases.

In view of the above-described superiority of the properties of the (000-1) face compared with those of the (0001) and (11-20) faces, an object of the present invention is to provide a SiC semiconductor device with a (000-1) face silicon carbide substrate in which the device is given a high blocking voltage and a high channel mobility by optimizing the method of heat-treatment used following gate oxide formation.

BRIEF DESCRIPTION OF THE DRAWINGS

FIG. 1 is a schematic diagram illustrating a method of manufacturing a MOS field effect transistor.

BEST MODE FOR CARRYING OUT THE INVENTION

Figure 2:
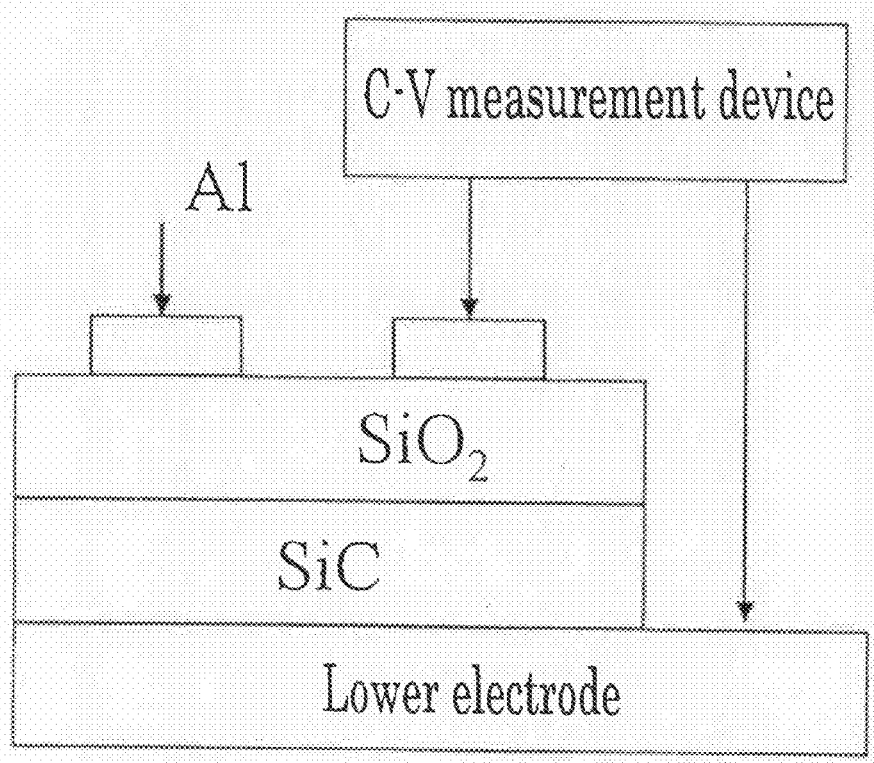
FIG. 2 is a schematic diagram showing the cross section of a MOS capacitor.

The present invention provides a semiconductor device and method of manufacturing same, in which the focus is on a technology for forming an oxide layer/silicon carbide interface in the (000-1) face, which has higher dielectric breakdown field strength than the (11-20) face and higher channel mobility than the (0001) face. The embodiments of the present invention will now be described in detail with reference to the drawings.

A specific example of the method of manufacturing a semiconductor device will be described with reference to FIG. 1.

FIG. 1 is a cross-sectional view of the process of fabricating a MOS transistor using a silicon carbide substrate, shown partway through the fabrication procedure. FIG. 1(*a*) shows a (000-1)-faced p-type silicon carbide substrate 1 (4H—SiC, impurity concentration of $5 \times 10^{15}$ cm$^{-3}$) on which RIE (reactive ion etching) has been used to form photolithography alignment marks, following standard RCA cleaning. It is also possible to use, as the substrate, a silicon carbide layer grown on a silicon substrate.

With reference to FIG. 1(*b*), source and drain regions were formed by ion implantation, using an ion implantation mask 4 of $SiO_2$ formed by thermal oxidation or CVD (chemical vapor deposition).

In the case of this example, as shown in FIG. 1(*b*), LTO (low temperature oxide) was used to form the ion implantation mask. The LTO layer was formed by reacting silane and oxygen at 400° C. to 800° C. to deposit silicon dioxide on the p-type silicon carbide substrate 1. After using photolithography to form the drain and source regions, HF (hydrogen fluoride) was used to etch the LTO down to the source and drain regions for the ion implantation. The source 3 and drain 4 shown in FIG. 1(*b*) were formed using nitrogen, phosphorus or arsenic ion implantation at 500° C. This was followed by activation heat treatment in an argon atmosphere at a temperature in the range of 1200° C. to 1700° C. In this example, the heat treatment consisted of five minutes at 1500° C. Next, the following were carried out to lean the substrate: 1) HF was used to etch away the sacrificial oxide layer; 2) the SiC substrate surface was subjected to ultraviolet radiation in an ozone atmosphere; followed by 3) 30 minutes of $H_2$ treatment at 1000° C.; and 4) carrying out 3) as a continuation of step 2). This was followed by oxidation in an atmosphere containing $O_2$ or $H_2O$ (water), at a temperature within the range of 800° C. to 1200° C., to thereby form the gate insulation layer 5 having a thickness of approximately 50 nm.

Oxidation using a gas containing $H_2O$ can be done by a method in which 1) vapor produced by heating $H_2O$ or 2) $H_2O$ produced by reacting $H_2$ (hydrogen) and $O_2$ (oxygen) is supplied to the substrate by a flow of oxygen or an inert gas (argon, nitrogen or helium). In this example, 1) or 2) was used to form a thermal oxidation layer. 2) was implemented at 800° C. to 1200° C. In this case too, $H_2O$ can also be supplied by a flow of inert gas. For comparison with the thermal oxidation layers, an LTO layer 50 nm thick was used to form the gate insulation layers, which was followed by heat treatment in an inert gas and cooling to room temperature. The step of heat-treating in an inert gas can be omitted, but is preferably included in order to manufacture a device having high reliability. The substrate was then heat-treated in an atmosphere containing $H_2$ or $H_2O$. In the case of $H_2$, the heat treatment was carried out at 400° C. to 900° C. In the case of $H_2O$, it is preferable to use a temperature of from 650° C. to 950° C. In this example, heat treatment was carried out at 660° C., 750° C., 850° C. and 950° C. All the water vapor used was produced by reacting $H_2$ and $O_2$ at 800° C., with the ratio [$O_2$]/[$H_2$] between the flow rates of the hydrogen gas and oxygen gas being adjusted within the range 0.1 to 10. In the case of FIG. 1, the ratio was 3. The $H_2O$ vapor can also be supplied by a flow of inert gas (argon, nitrogen or helium). The substrate was then heat-treated in an inert gas, such as argon or nitrogen or the like. This step of heat-treating in an inert gas can be omitted, but is preferably included in order to manufacture a device having high reliability. This was followed by $H_2O$ heat treatment at a low temperature, which was followed by $H_2$ heat treatment. The second heat treatment using $H_2$ or $H_2O$ can be omitted, but is preferably included in order to manufacture a device having high reliability. In this example, the $H_2O$ treatment was carried out at 650° C. and 850° C., and the following hydrogen treatment at 800° C.

Next, gate electrode 6 was formed. The gate electrode 6 can be formed of aluminum or n- or p-type polysilicon. This can be followed by forming thereon another layer of a silicide, such as $WSi_2$, $MoSi_2$ or $TiSi_2$. The gate electrode is then formed by etching the aluminum, n-type silicon or p-type silicon. An oxide layer is then deposited thereon, and a contact hole is locally etched in the oxide layer. Then, wet-etching is performed after vapor deposition of aluminum. Vapor deposition or sputtering is then used to form a metal layer containing nickel, titanium or aluminum, or a multilayer of metal layers, and RIB or wet-etching can be used to form a metal contact line 10. This was followed by heat treatment in nitrogen to complete the MOSFET.

A MOS capacitor was also fabricated, as follows. First, a 10-nm-thick sacrificial oxide layer was formed on a (000-1) face n-type silicon carbide substrate (4H—SiC, impurity concentration of $5 \times 10^{15}$ cm$^{-3}$) that had been cleaned using standard RCA cleaning. The sacrificial oxide layer was removed using 5% hydrogen fluoride, and the gate insulation layer was formed and heat-treated. The gate insulation layer is formed and the following heat treatment carried out by the same methods used to manufacture a MOSFET. The vapor deposition method is then used to form an aluminum layer on the gate insulation layer and on the underside of the SiC substrate, and this is followed by the formation of a metal substrate on the underside, thereby completing the fabrication of the MOS capacitor having the cross-sectional structure shown in FIG. 2.

Annealing in an inert gas (argon) was used following oxidation in both cases, that is, when the gate oxide layer was formed in dry oxygen and when the gate oxide layer was formed in a $H_2O$ atmosphere. However, the MOSFFTs in which the gate oxide layer was formed in dry oxygen did not work. MOSFETs in which the gate oxide layer was formed in a $H_2O$ atmosphere did work, and had channel mobility of 50 cm$^2$/Vs. Thus, MOSFETs could operate when the gate oxide layer was formed in a $H_2O$ atmosphere at not more than 1150° C., even on the (000-1) face.

Figure 3:
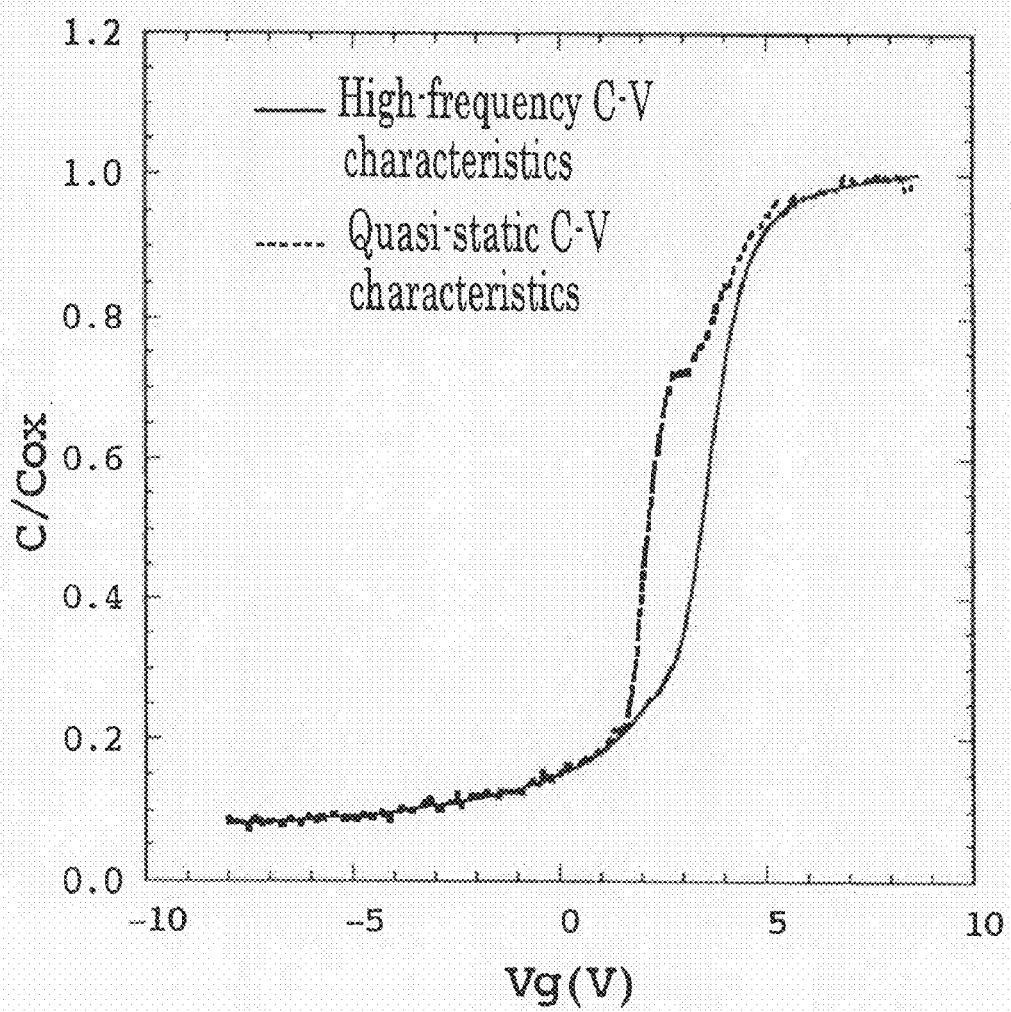
FIG. 3 shows the C—V characteristics of MOS capacitors having a gate insulation layer formed using heat treatment in an atmosphere of dry oxygen and Ar (argon), $H_2$ (hydrogen) and $H_2O$ (water). The solid lines show high-frequency C—V characteristics and the broken lines show quasi-static C—V characteristics.

FIG. 3 shows the high-frequency C—V characteristics (measurement frequency f=100 kHz) and quasi-static C—V characteristics (step voltage Vs=50 mV, delay time $t_d$=10 seconds) of sample MOS capacitors that, following formation of the gate insulation layer at 950° C. to 1200° C. in an atmosphere containing $H_2O$, were heat-treated for 30 minutes in an argon atmosphere. The solid lines show the high-frequency C—V characteristics and the broken lines show the quasi-static C—V characteristics. A larger difference between the two C—V characteristics indicates a higher interface trap density ($D_{it}$).

Figure 4:
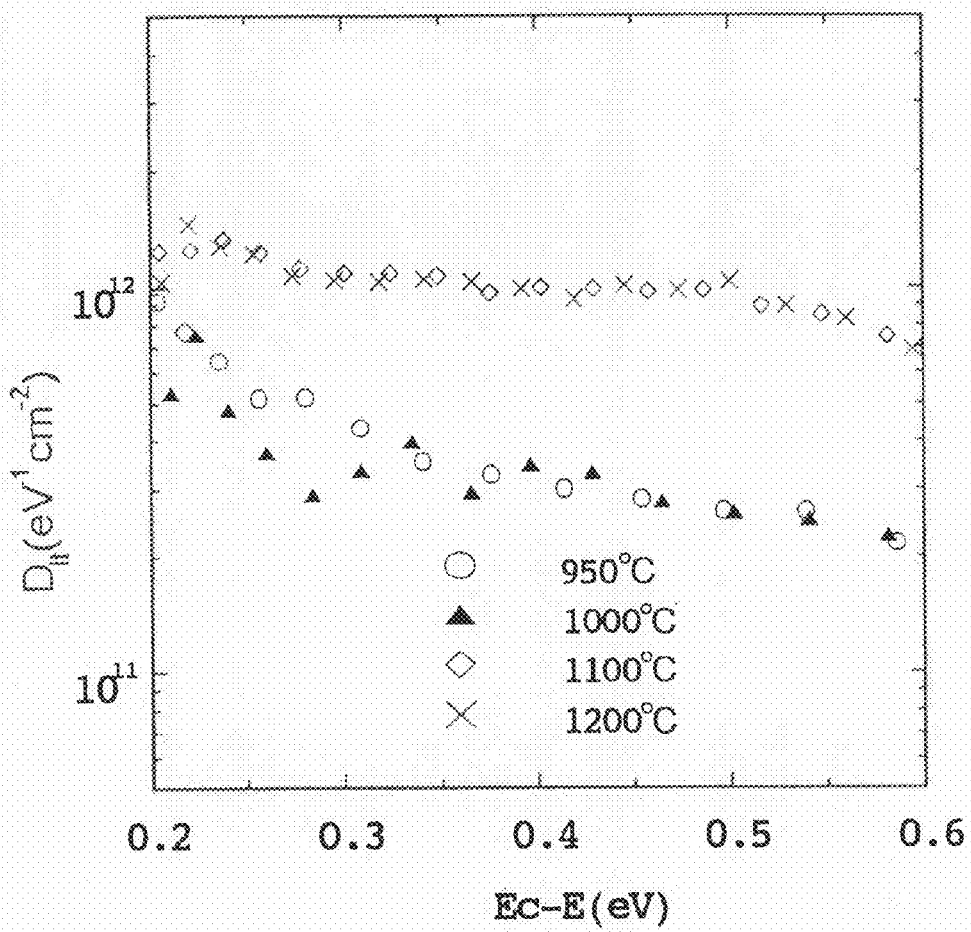
FIG. 4 shows distributions of interface trap density within the energy gap calculated from the C—V characteristics of FIG. 3.

FIG. 4 shows the distributions of the interface trap density ($D_{it}$) within the SiC energy band, calculated from the C—V characteristics of FIG. 3 by means of equation 1. Here, $C_h$ is the high-frequency capacitance, $C_q$ is the quasi-static capacitance, $C_{ox}$ is the oxide layer capacitance, and q is the electron charge.

$$D_{it} = \frac{1}{q}\left[\left(\frac{1}{C_q} - \frac{1}{C_{ox}}\right)^{-1} - \left(\frac{1}{C_h} - \frac{1}{C_{ox}}\right)^{-1}\right] \quad \text{Equation 1}$$

FIG. 4 shows the interface trap densities of samples that, after formation of the gate insulation layer at 950° C. to 1200° C. in an atmosphere containing $H_2O$ vapor, were heat treated for 30 minutes in an argon atmosphere. Up to an oxidation temperature of 1100° C. or above, the $D_{it}$ is high and substantially constant, but decreases when the temperature drops below 1100° C. and becomes constant below 1000° C. Therefore, it is preferable to use an oxidation temperature that is lower than 1100° C.

Figure 5:
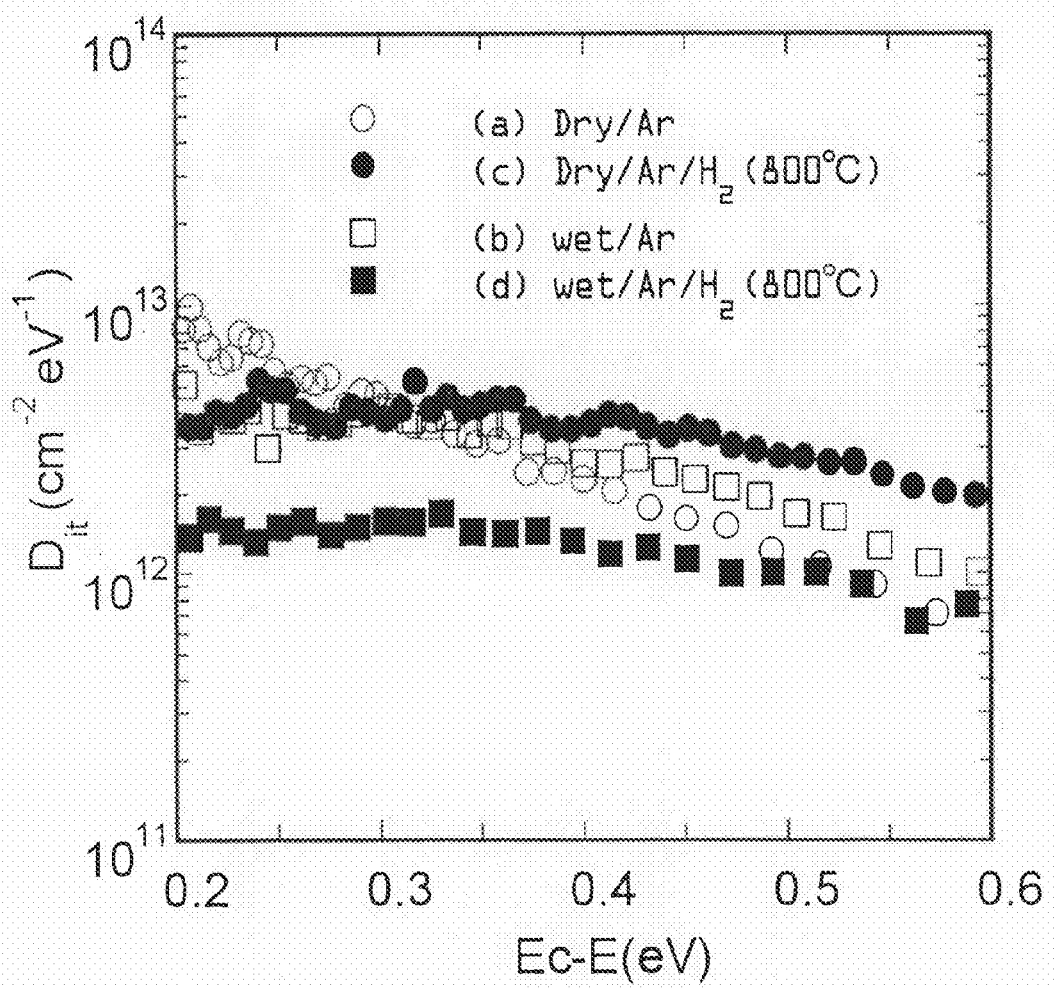
FIG. 5 shows distributions of interface trap density within the energy gap calculated from the C—V characteristics of MOS capacitors having a gate insulation layer formed by oxidation in a $H_2O$ atmosphere and heat treatment in an atmosphere of Ar, $H_2$ and $H_2O$).

FIG. 5 shows a comparison of SiC substrate samples thermally oxidized in dry oxygen (Dry) and in a $H_2O$ atmosphere (Wet) that were just heat-treated in argon and that were also heat-treated in argon and further heat-treated in hydrogen at 800° C. It can be seen that whatever the oxidation method used, hydrogen heat treatment reduces the $D_{it}$. Thus, hydrogen heat treatment has a $D_{it}$-reducing effect.

Figure 6:
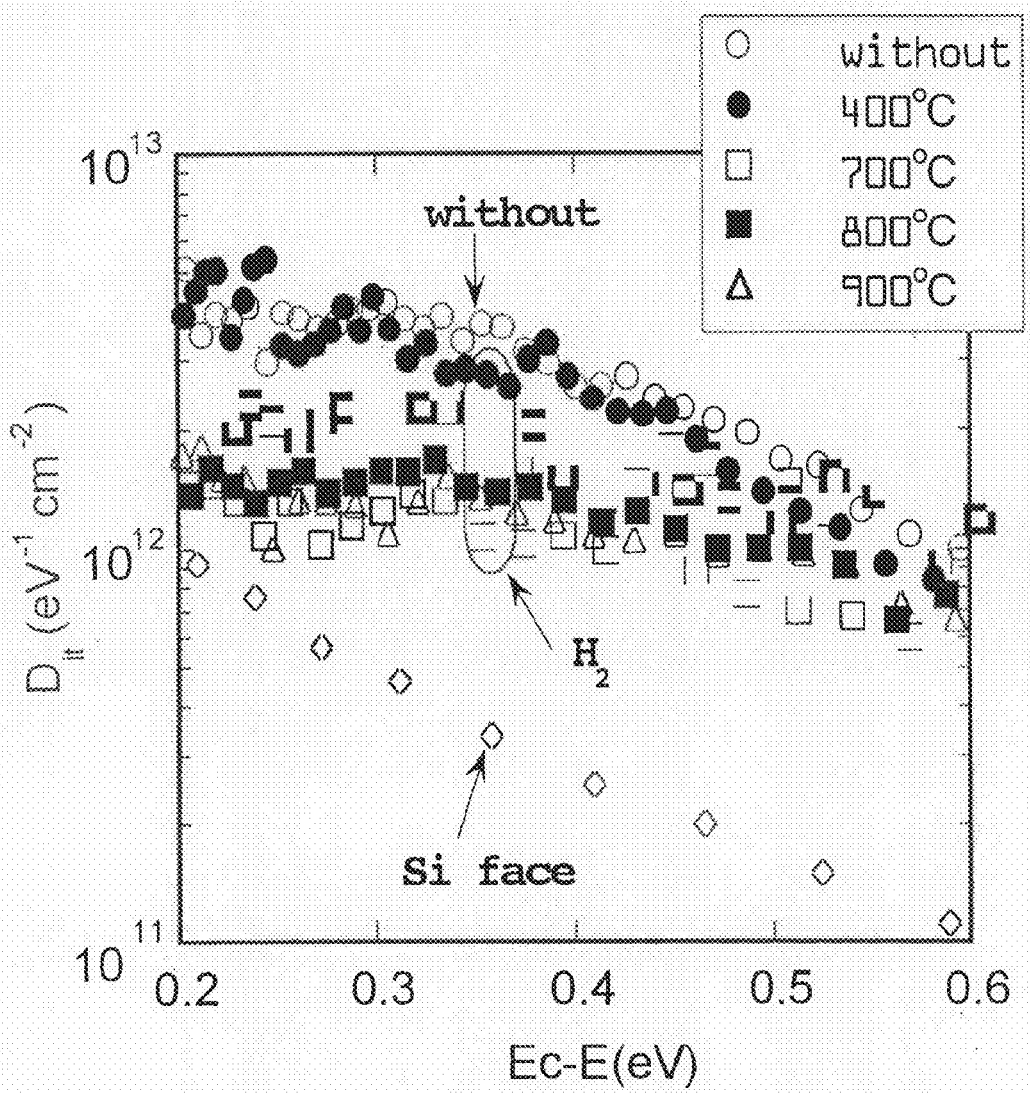
FIG. 6 shows the interface trap density values obtained at hydrogen-heat-treatment temperatures ranging from 400° C. to 900° C., following oxidation in an $H_2O$ atmosphere and heat-treatment in argon.

FIG. 6 shows interface trap densities obtained at hydrogen heat treatment temperatures ranging from 400° C. to 900° C., following oxidation in a $H_2O$ atmosphere and heat treatment in argon. Up to 400° C. there is no change, but above 400° C. there is a sharp reduction in density, and at 800° C. and above, there is saturation. At high temperatures over 1000° C., the hydrogen reduces the gate insulation layer, degrading the reliability of the gate insulation layer, so it is desirable to limit the temperature of the hydrogen heat treatment to 400° C. to 1000° C.

Figure 7:
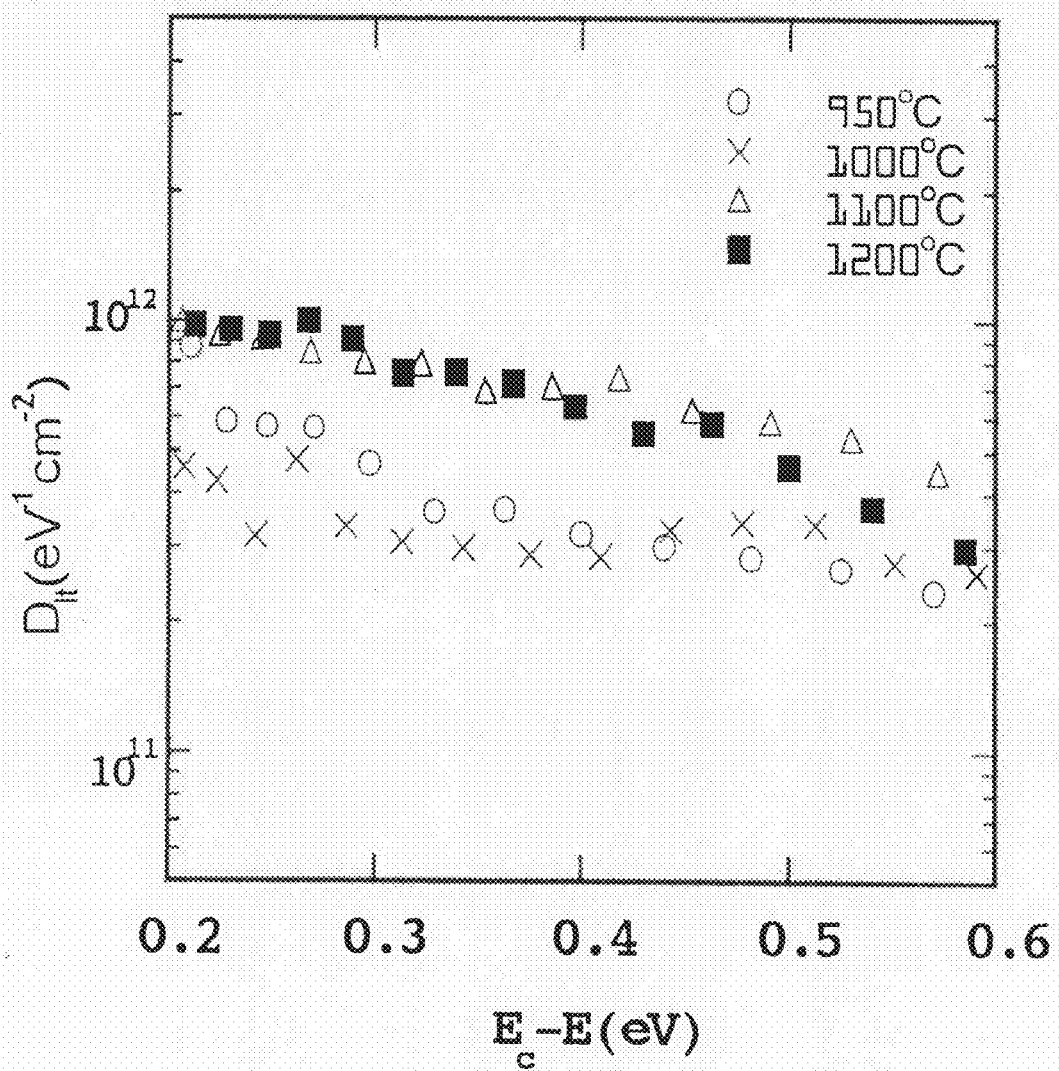
FIG. 7 shows the interface trap density values obtained at $H_2O$-heat-treatment temperatures of 650° C., 750° C., 850° C. and 950° C., following formation of the gate oxide layer in an $H_2O$ atmosphere and heat-treatment in argon.

FIG. 7 shows the effect of the oxidation temperature on the interface trap density when gate oxide layers formed in a $H_2O$ atmosphere at 950° C. to 1200° C. are heat-treated in an argon atmosphere, and are then also heat-treated at 800° C. in an atmosphere containing hydrogen gas. Up to an oxidation temperature of 1100° C. or above, the $D_{it}$ is high and substantially constant, but decreases when the temperature drops below 1100° C. and becomes constant below 1000° C. Therefore, when gate insulation layer formation is followed by hydrogen heat treatment, it is preferable to use an oxidation temperature that is lower than 1100° C.

Figure 8:
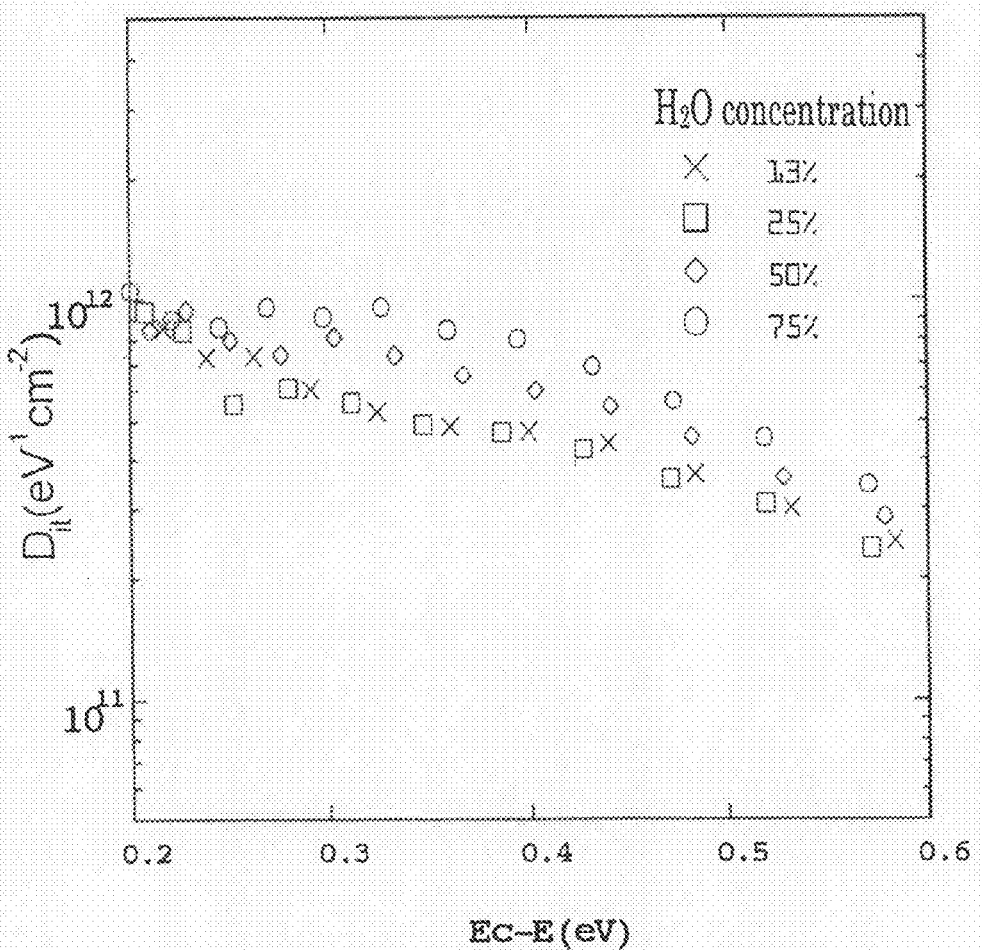
FIG. 8 shows the effect of the oxidation temperature on the interface trap density after heat treatment at 800° C. in hydrogen gas, following formation of the gate oxide layer in an $H_2O$ atmosphere and heat treatment in an argon atmosphere.

FIG. 8 shows how the interface trap density is affected by the $H_2O$ concentration during gate insulation layer formation in a $H_2O$ atmosphere when, following the formation of the gate insulation layer in the $H_2O$ atmosphere, the gate insulation layer is heat-treated in an argon atmosphere, and is then also heat-treated at 800° C. in a hydrogen atmosphere. The interface trap density is constant up to a $H_2O$ vapor concentration of 25%, but increases at a concentration of 50% or more. Therefore, it is preferable to use a $H_2O$ vapor concentration that is lower than 50%.

With respect to these results, Table 1 shows the relationship between gate insulation layer formation conditions, post-oxidation heat treatment conditions and the MOSFET channel mobility.

TABLE 1

| Method of forming gate oxide layer | Gate oxide layer formation/heat treatment method | | |
|---|---|---|---|
| | Ar (1100° C.) | Ar + $H_2$ (1100° C.) | Ar (950° C.) |
| $H_2O$ (water) atmosphere | 50 cm²/Vs | 72 cm²/Vs | 65 cm²/Vs |

When the gate insulation layer was formed in a $H_2O$ atmosphere, the channel mobility was 50 cm²/Vs, but when the formed layer was heat-treated in $H_2$, the channel mobility became 72 cm²/Vs. When an oxidation temperature of 950° C. was used, the channel mobility was 65 cm²/Vs, so the channel mobility was improved by reducing the temperature.

Table 2 shows the results of a comparison between gate insulation layers formed using LTO and formed using thermal oxidation. In both cases, POA (post-oxidation annealing) was carried out in argon. The results show that a thermal oxidation layer has the effect of improving the channel mobility.

TABLE 2

| Gate oxidation layer | Channel mobility |
|---|---|
| LTO layer | <10 cm²/Vs |
| Thermal oxidation layer | 50 cm²/Vs |

Next, Table 3 shows the results of channel mobility obtained when pure water was heated to produce $H_2O$ vapor that was carried by argon gas to oxidize the silicon carbide substrate, and when the substrate was oxidized using $H_2O$ produced by the reaction of $H_2$ and $O_2$ and carried to the substrate by argon gas. The gate insulation layer was formed using a temperature of 1150° C. for 14 minutes. From the results, it can be seen that channel mobility is higher using $H_2O$ produced by the reaction of $H_2$ and $O_2$, showing there is a channel mobility improvement effect.

TABLE 3

| $H_2O$ production method | Channel mobility |
|---|---|
| Vaporization of pure water | <10 cm²/Vs |
| Combustion of $H_2$ and $O_2$ | 50 cm²/Vs |

Table 4 shows the effect that cleaning has on the channel mobility. The gate insulation layer was formed using a temperature of 1150° C. for 14 minutes.

TABLE 4

| SiC Substrate cleaning method | Channel mobility |
|---|---|
| None | 50 cm²/Vs |
| Ultraviolet radiation in ozone | 55 cm²/Vs |
| Hydrogen annealing | 57 cm²/Vs |
| Ultraviolet radiation in ozone + hydrogen annealing | 60 cm²/Vs |

These results show that the channel mobility is higher when the substrate is cleaned than when it is not cleaned. Channel mobility was 55 cm²/Vs after cleaning using ultraviolet radiation in ozone, 57 cm²/Vs after cleaning by hydrogen annealing and 60 cm²/Vs after cleaning by ultraviolet radiation in ozone plus hydrogen annealing. This shows that the channel mobility is improved by cleaning by ultraviolet radiation in ozone, cleaning by hydrogen annealing and cleaning by ultraviolet radiation in ozone combined with hydrogen annealing.

Figure 9:
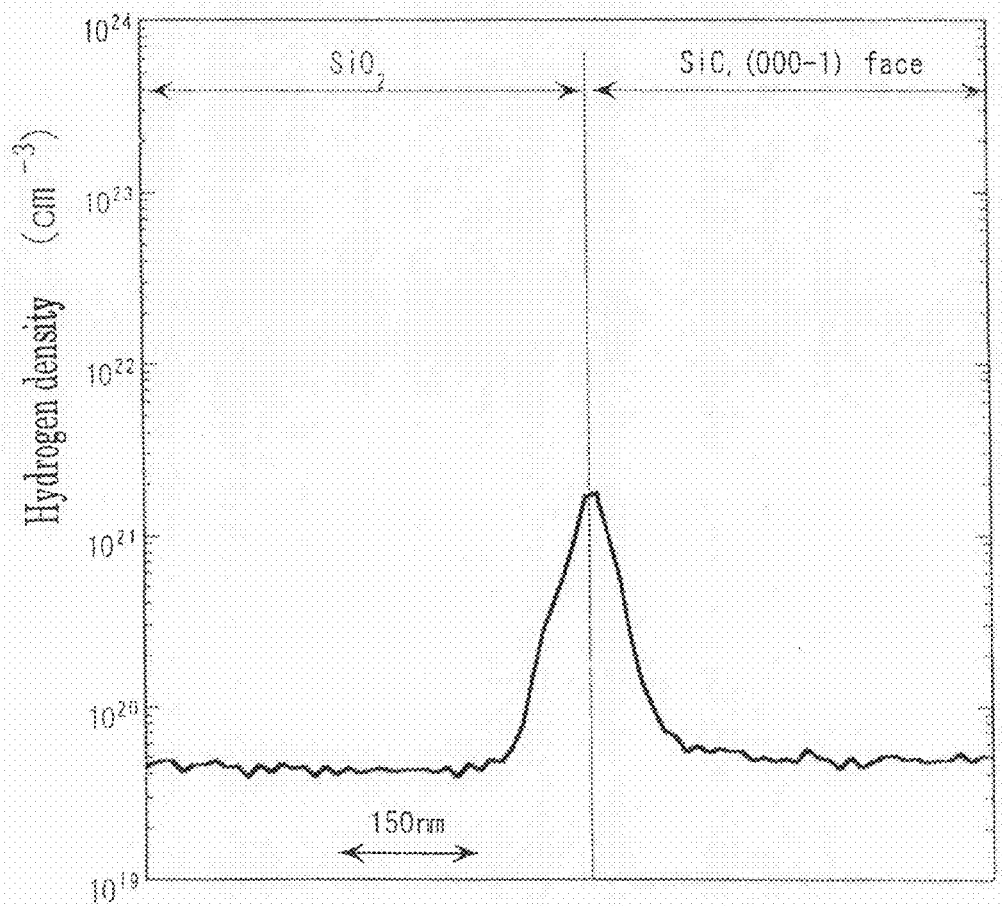
FIG. 9 shows the hydrogen density in a $SiO_2$ layer and $SiO_2$/SiC interface formed by oxidizing a (000-1) face SiC substrate in a $H_2O$ and $O_2$ (oxygen) atmosphere, measured using secondary ion mass spectroscopy (SIMS). The primary ion species used was Cs.

FIG. 9 shows the hydrogen density in a $SiO_2$ and $SiO_2/SiC$ interface formed by oxidizing a (000-1) face SiC substrate in a $H_2O$ and $O_2$ (oxygen) atmosphere, measured using secondary ion mass spectroscopy (SIMS). The primary ion used was Cs.

The channel mobility was 100 $cm^2/Vs$ or more in a semiconductor device in which the hydrogen content of the gate oxide layer was $1\times10^{19}/cm^3$ or more. However, because exceeding $1\times10^{20}/cm^3$ can lead to a decrease in electric field strength of the oxide layer due to the reduction of the oxide layer by the hydrogen, the content is limited to $1\times10^{19}/cm^3$ to $1\times10^{20}/cm^3$. The channel mobility was 100 $cm^2/Vs$ or more in a semiconductor device having an interface between a gate oxide layer and a semiconductor region in which the hydrogen content was $1\times10^{21}/cm^3$ or more. However, because exceeding $1\times10^{22}/cm^3$ can lead to a decrease in the electric field strength due to the reduction of the oxide layer by the hydrogen, the content is limited to $1\times10^{20}/cm^3$ to $1\times10^{22}/cm^3$.

Figure 10:
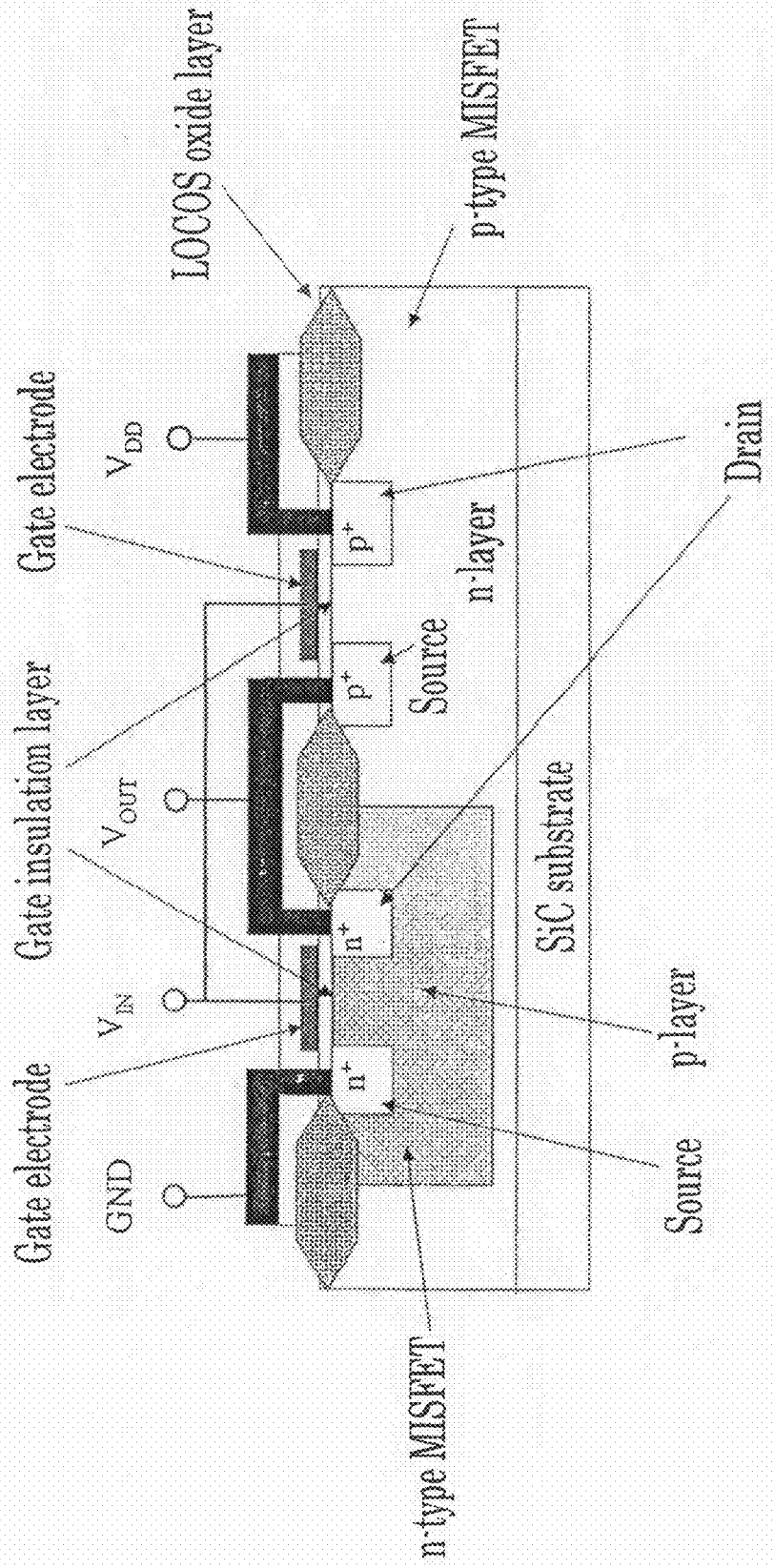
FIG. 10 is a cross-sectional view of a complementary metal-insulator-semiconductor (CMIS) circuit comprised of an n-channel metal-insulator-semiconductor field effect transistor (MISFET) and a p-channel MISFET.

FIG. 10 is a cross-sectional view of a complementary metal insulator semiconductor (CMIS) structure comprised of an n-channel metal insulator semiconductor field effect transistor (n-channel MISFET) and a p-channel MISFET.

CMIS device and fabrication process of the same are described below. On the (000-1) face or a face inclined by about 8 degrees or less from the (000-1) face of n- or p-type semi-insulating silicon carbide (4H—SiC bulk substrate) (having a thickness of 300 μm), n-type silicon carbide having a concentration of $5\times10^{15}$ $cm^{-3}$ to $1\times10^{16}$ $cm^{-3}$ was deposited to a thickness of 5 μm to 15 μm by chemical vapor deposition, using nitrogen as the impurity. Next, a portion in which an n-channel MISFET structure was to be formed, which is referred to as p-type well, was formed in the n-type silicon carbide layer by ion implantation of aluminum or boron, which are p-type impurities. Next, high concentration n-type regions in which the source and drain regions of the n-channel MISFET structure and a contact to the n-type body region of a p-channel MISFET structure were to be formed were formed by nitrogen or phosphor ion implantation. Furthermore, high concentration p-type regions in which the source and drain regions of the p-channel MISFET structure and a contact to the p-type body region of the n-channel MISFET structure were to be formed were formed by aluminum or boron ion implantation. In this step, a silicon dioxide film formed by chemical vapor deposition was used as the ion implantation mask. However, a silicon nitride mask can also be used. After hydrogen fluoride was used to form an opening for ion implantation in the silicon dioxide film, ion implantation was carried out at a temperature in the range of room temperature to 1000° C. This was followed by 10 seconds to 10 minutes of activation heat treatment in an argon atmosphere at a temperature in the range of 1200° C. or lower to 2000° C., preferably in the range of 1500° C. to 2000° C., or more preferably at a temperature of 1700° C.

Next, a field layer of silicon dioxide was formed by chemical vapor deposition, and an opening for an device region was formed. Next, the surface of the n-type silicon carbide layer on which gate electrodes of the n-channel MISFET and the p-channel MISFET were to be formed was subjected to thermal oxidation in an atmosphere containing dry oxygen, or water, oxygen and an inert gas at a temperature in the range of 700° C. to 1200° C., thereby forming a gate oxide film, Next, a polysilicon film was formed by chemical vapor deposition, and an n- or p-type impurity was doped into the polysilicon mm by chemical vapor deposition or ion implantation to form n- or p-type polysilicon. Next, the polysilicon electrode and the gate insulation film were wet-etched or dry-etched to form the gate electrodes. Next, an interlayer insulation film of silicon dioxide, silicon dioxide containing boron or phosphor introduced by chemical vapor deposition or silicon nitride was formed, and an ohmic contact electrode forming opening was formed by etching. Next, aluminum and nickel were sputtered or vapor-deposited and patterned by wet etching, dry etching or the lift-off process. Next, heat treatment was carried out in an inert atmosphere containing hydrogen at a temperature in the range of 800° C. to 1000° C., thereby forming an ohmic electrode. Then, a pad or metal wiring of aluminum, an alloy containing silicon or copper, or copper was formed by sputtering or vapor deposition. As required, a surface protection film of silicon dioxide, silicon nitride or polyimide can be formed. Then, a hole for the electrode was formed, and the process was completed.

Figure 11:
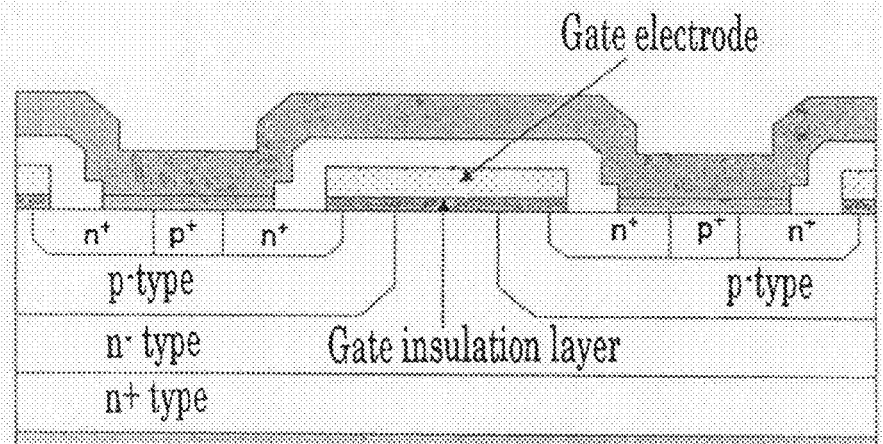
FIG. 11 is a cross sectional view of a double implanted metal-insulator-semiconductor (DMIS) structure.

FIG. 11 is a cross-sectional view of a double implanted metal insulator semiconductor (DMIS) structure.

DMIS element and fabrication process of the same are described below. On the (000-1) face or a face inclined by about 8 degrees or less from the (000-1) face of n-type silicon carbide (4H—SiC bulk substrate) (having a specific resistance of 0.02 Ωcm and a thickness of 300 μm), a buffer n-type silicon carbide buffer layer containing nitrogen as an impurity was formed by chemical vapor deposition. The buffer layer may not be formed. On the n-type buffer layer, an n-type silicon carbide layer was formed. Next, a portion in which a channel for current was to be formed, which is referred to as p-type well, was formed in the n-type silicon carbide layer by ion implantation of aluminum or boron, which are p-type impurities. Next, a source region was formed by ion implantation of nitrogen or phosphor, which are n-type impurities. Furthermore, a high concentration p-type region in which an ohmic region was to be formed was formed in the p-type body region by ion implantation of aluminum or boron. In this step, a silicon dioxide film formed by chemical vapor deposition was used as the ion implantation mask. However, a silicon nitride mask can also be used. After hydrogen fluoride was used to form an opening for ion implantation in the silicon dioxide in, ion implantation was carried out at a temperature in the range of room temperature to 1000° C. This was followed by 10 seconds to 10 minutes of activation heat treatment in an argon atmosphere at a temperature in the range of 1200° C. or lower to 2000° C., preferably in the range of 1500° C. to 2000° C., or more preferably at a temperature of 1700° C.

Next, the surface of the n-type silicon carbide layer was subjected to thermal oxidation in an atmosphere containing dry oxygen, or water, oxygen and an inert gas at a temperature in the range of 700° C. to 1200° C., thereby forming a gate oxide film on the source region, a well region and the n-type buffer layer. Next, a polysilicon film was formed by chemical vapor deposition, and an n- or p-type impurity was doped into the polysilicon film by chemical vapor deposition or ion implantation to form n- or p-type polysilicon. Next, the polysilicon electrode and the gate insulation film were wet-etched or dry-etched to form a gate electrode. Next, an interlayer insulation film of silicon dioxide, silicon dioxide containing boron or phosphor doped by chemical vapor deposition or silicon nitride was formed, and an ohmic contact electrode forming opening was formed by etching. Next, aluminum and nickel were sputtered or vapor-deposited. Furthermore, after sputtering or vapor deposition was used to form a backside electrode (Ni layer or Ti layer) on the (0001) face on the back side of the bulk substrate and an electrode in the source region, heat treatment was carried out in an inert atmosphere containing hydrogen at a temperature in the range of 800° C. to 1000° C. Then, a pad or metal wiring of aluminum, an alloy containing silicon or copper, or copper was formed by sputtering or vapor deposition. Furthermore, as required, a metal for die bonding can be sputtered or vapor-deposited on the backside electrode. Furthermore, as required, a surface protection film of silicon dioxide, silicon nitride or polyimide can be formed. Then, a hole for the electrode was formed, and the process was completed.

Figure 12:
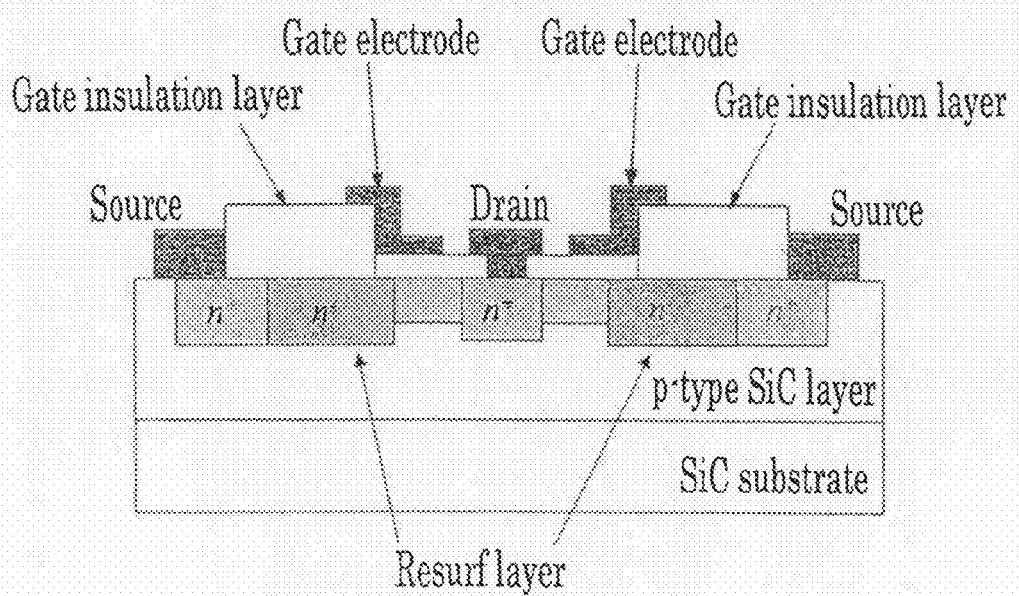
FIG. 12 is a cross-sectional view of a lateral resurf MISFET structure.

FIG. 12 is a cross-sectional view of a lateral resurf MISFET structure.

Lateral resurf MISFET and fabrication process of the same are described below. On the (000-1) face or a face inclined by about 8 degrees or less from the (000-1) face of n- or p-type semi-insulating silicon carbide (4H—SiC bulk substrate) (having a thickness of 300 μm), p-type silicon carbide 2 having a concentration of $5\times10^{15}$ $cm^{-3}$ to $1\times10^{16}$ $cm^{-3}$ was deposited to a thickness of 5 μm to 15 μm by chemical vapor deposition, using aluminum or boron as the impurity. Next, a portion referred to as resurf layer was formed by ion implantation of nitrogen or phosphor, which are n-type impurities. The resurf layer had a concentration in the range of $1\times10^{16}$ $cm^{-3}$ to $1\times10^{18}$ $cm^{-3}$ and a thickness of about 0.2 μm to 1 μm. The concentration and thickness depend on the blocking voltage. Next, source and drain regions were formed by high concentration ion implantation of nitrogen or phosphor, which are n-type impurities. Furthermore, a high concentration p-type region in which an ohmic region was to be formed was formed in the p-type region by aluminum or boron ion implantation. In this step, a silicon dioxide film formed by chemical vapor deposition was used as the ion implantation mask. However, a silicon nitride mask can also be used. After hydrogen fluoride was used to form an opening for ion implantation in the silicon dioxide film, ion implantation was carried out at a temperature in the range of room temperature to 1000° C. This was followed by 10 seconds to 10 minutes of activation heat treatment in an argon atmosphere at a temperature in the range of 1200° C. or lower to 2000° C., preferably in the range of 1500° C. to 2000° C., or more preferably at a temperature of 1700° C.

Next, a field layer of silicon dioxide was formed by chemical vapor deposition, and an opening for an element region was formed. Next, the surfaces of the resurf layer, the source region and the drain region were subjected to thermal oxidation in an atmosphere containing dry oxygen, or water, oxygen and an inert gas at a temperature in the range of 700° C. to 1200° C., thereby forming a gate oxide film. Next, a polysilicon film was formed by chemical vapor deposition, and an n- or p-type impurity was doped into the polysilicon film by chemical vapor deposition or ion implantation to form n- or p-type polysilicon. Next, the polysilicon electrode and the gate insulation film were wet-etched or dry-etched to form the gate electrodes. Next, an interlayer insulation film of silicon dioxide, silicon dioxide containing boron or phosphor doped by chemical vapor deposition or silicon nitride was formed, and an ohmic contact electrode forming opening was formed by etching. Next, aluminum and nickel were sputtered or vapor-deposited and patterned by wet etching, dry etching or the lift-off process. Next, heat treatment was carried out in an inert atmosphere containing hydrogen at a temperature in the range of 800° C. to 1000° C., thereby forming an ohmic electrode. Then, a pad or metal wiring of aluminum, an alloy containing silicon or copper, or copper was formed by sputtering or vapor deposition. As required, a surface protection film of silicon dioxide, silicon nitride or polyimide can be formed. Then, a hole for the electrode was formed, and the process was completed.

Figure 13:
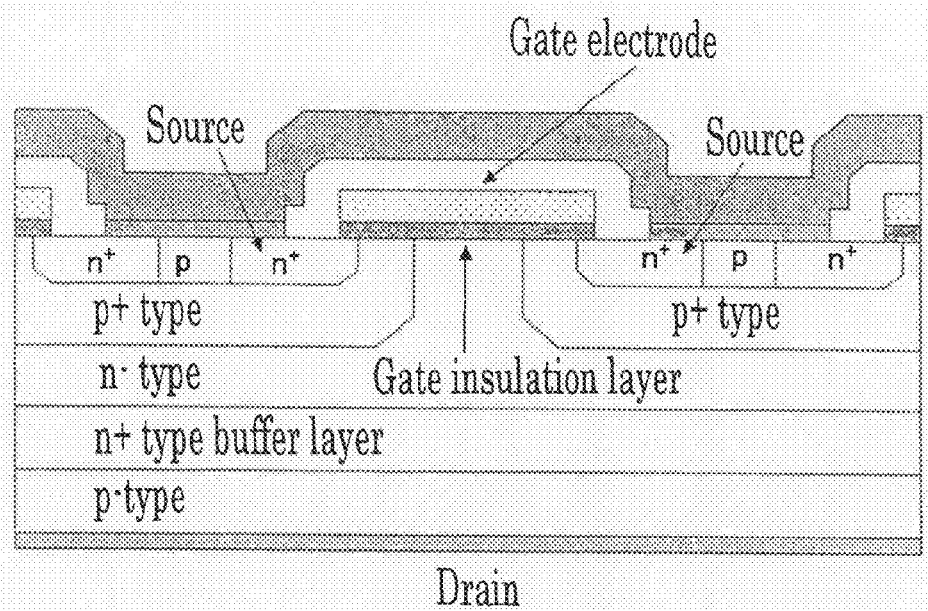
FIG. 13 is a cross-sectional view of an insulator gate bipolar transistor (IGBT) structure. The n+ buffer layer may be omitted.

FIG. 13 is a cross-sectional view of an n-channel type insulated gate bipolar transistor (IGBT) structure.

Fabrication process of n-channel IGBT element is described below. On the (000-1) face or a face inclined by about 8 degrees or less from the (000-1) face of p-type silicon carbide (4H—SiC bulk substrate), an n-type silicon carbide layer containing nitrogen or phosphor as an impurity was formed by chemical vapor deposition. In the case of forming a punch-through type, a high concentration n-type silicon carbide layer is formed between the p-type silicon carbide 1 and the n-type silicon carbide layer. Next, a portion in which a channel for current was to be formed, which is referred to as p-type well, was formed in the n-type silicon carbide layer by ion implantation of aluminum or boron, which are p-type impurities. Next, a source region was formed by ion implantation of nitrogen or phosphor, which are n-type impurities. Furthermore, a high concentration p-type region in which an ohmic region was to be formed was formed in the p-type body region by ion implantation of aluminum or boron. In this step, a silicon dioxide film formed by chemical vapor deposition was used as the ion implantation mask. However, a silicon nitride mask can also be used. After hydrogen fluoride was used to form an opening for ion implantation in the silicon dioxide film, ion implantation was carried out at a temperature in the range of room temperature to 1000° C. This was followed by 10 seconds to 10 mutes of activation heat treatment in an argon atmosphere at a temperature in the range of 1200° C. or lower to 2000° C., preferably in the range of 1500° C. to 2000° C., or more preferably at a temperature of 1700° C.

Next, the surfaces of the source region, a contact region and the n-type silicon carbide layer were subjected to thermal oxidation in an atmosphere containing dry oxygen, or water, oxygen and an inert gas at a temperature in the range of 700° C. to 1200° C., thereby forming a gate oxide film. Next, a polysilicon film was formed by chemical vapor deposition, and an n- or p-type impurity was doped into the polysilicon film by chemical vapor deposition or ion implantation to form n- or p-type polysilicon. Next, the polysilicon electrode and the gate insulation film were wet-etched or dry-etched to form a gate electrode. Next, an interlayer insulation film of silicon dioxide, silicon dioxide containing boron or phosphor doped by chemical vapor deposition or silicon nitride was formed, and an ohmic contact electrode forming opening was formed by etching. Next, aluminum and nickel were sputtered or vapor-deposited. After sputtering or vapor deposition was used to form a backside electrode Ni layer or Ti layer) on the (0001) face on the back side of the bulk substrate and an electrode (front side electrode) in the source region, heat treatment was carried out in an inert atmosphere containing hydrogen at a temperature in the range of 800° C. to 1000° C., thereby completing the front side electrode and the backside electrode. Then, a pad or metal wiring of aluminum, an alloy containing silicon or copper, or copper was formed by sputtering or vapor deposition. Furthermore, as required, a metal for die bonding can be sputtered or vapor-deposited on the backside electrode. Furthermore, as required, a surface protection film of silicon dioxide, silicon nitride or polyimide can be formed. Then, a hole for the electrode was formed, and the process was completed.

Figure 14:
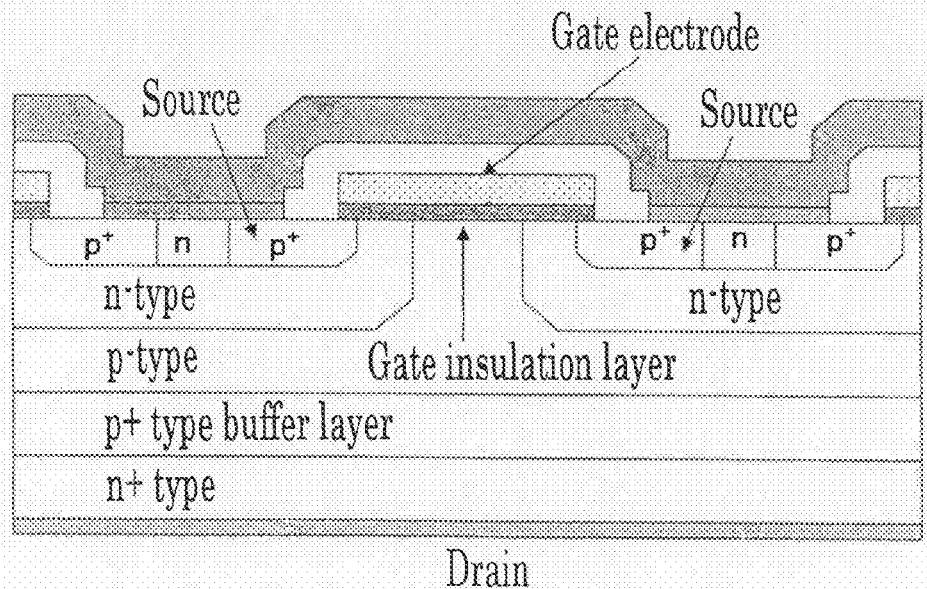
FIG. 14 is a cross-sectional view of a p-channel IGBT structure. The p+ buffer layer may be omitted.

FIG. 14 is a cross-sectional view of a p-channel type insulated gate bipolar transistor (IGBT) structure.

Fabrication process of p-channel IGBT element is described below. On the (000-1) face or a face inclined by about 8 degrees or less from the (000-1) face of n-type silicon carbide (4H—SiC bulk substrate), a p-type silicon carbide layer containing aluminum or boron an impurity was formed by chemical vapor deposition. In the case of forming a punch-through type, a high concentration p-type silicon carbide layer is formed between the n-type silicon carbide and the p-type silicon carbide layer. Next, a portion in which a channel for current was to be formed, which is referred to as n-type well, was formed in the p-type silicon carbide layer by ion implantation of nitrogen or phosphor, which are n-type impurities. Next, a source region was formed by ion implantation of aluminum or boron, which are p-type impurities. Furthermore, a high concentration n-type region in which an ohmic region was to be formed was formed in the n-type body region by ion implantation of nitrogen or phosphor. In this step, a silicon dioxide film formed by chemical vapor deposition was used as the ion implantation mask. However, a silicon nitride mask can also be used. After hydrogen fluoride was used to form an opening for ion implantation in the silicon dioxide film, ion implantation was carried out at a temperature in the range of room temperature to 1000° C. This was followed by 10 seconds to 10 minutes of activation heat treatment in an argon atmosphere at a temperature in the range of 1200° C. or lower to 2000° C., preferably in the range of 1500° C. to 2000° C., or more preferably at a temperature of 1700° C.

Next, the surfaces of the source region, a contact region and the p-type silicon carbide layer were subjected to heat oxidation in an atmosphere containing dry oxygen, or water, oxygen and an inert gas at a temperature in the range of 700° C. to 1200° C., thereby forming a gate oxide film. Next, a polysilicon mill was formed by chemical vapor deposition, and an n- or p-type impurity was doped into the polysilicon film by chemical vapor deposition or ion implantation to form U- or p-type polysilicon. Next, the polysilicon electrode and the gate insulation film were wet-etched or dry-etched to form a gate electrode. Next, an interlayer insulation film of silicon dioxide, silicon dioxide containing boron or phosphor doped by chemical vapor deposition or silicon nitride was formed, and an ohmic contact electrode forming opening was formed by etching. Next, aluminum and nickel were sputtered or vapor-deposited. After sputtering or vapor deposition was used to form a backside electrode (Ni layer or Ti layer) on the (0001) face on the back side of the bulk substrate and an electrode (front side electrode) in the source region, heat treatment was carried out in an inert atmosphere containing hydrogen at a temperature in the range of 800° C. to 1000° C., thereby completing the front side electrode and the backside electrode. Then, a pad or metal wiring of aluminum, an alloy containing silicon or copper, or copper was formed by sputtering or vapor deposition. Furthermore, as required, a metal for die bonding can be sputtered or vapor-deposited on the backside electrode. Furthermore, as required, a surface protection film of silicon dioxide, silicon nitride or polymide can be formed. Then, a hole for the electrode was formed, and the process was completed.

INDUSTRIAL APPLICABILITY

The Structure (SiC semiconductor device) according to the invention, configured as described in the foregoing, is suitable for application to semiconductor devices that use gate insulation layers, such as those of power devices having high blocking voltage and high channel mobility, particularly to MOS capacitors, MOSFETs, CMS circuits and DMIS circuits composed of n-channel MISFETs and p-channel MISFETs, and IGBT circuits.

The invention claimed is:

1. A CMIS device, comprising:
a substrate having a (000-1) face or a face inclined from the (000-1) face;
a first-conductive-type silicon carbide layer formed on said substrate;
a high concentration impurity region formed in said first-conductive-type silicon carbide layer to provide an n-channel MISFET and a p-channel MISFET;
a gate insulation film containing $1\times10^{19}/cm^3$ to $1\times10^{22}/cm^3$ of hydrogen formed on the first-conductive-type silicon carbide layer or on the first-conductive-type silicon carbide layer with a high concentration impurity region, wherein a hydrogen content in an interface between the gate insulation film and the first-conductive-type silicon carbide layer is $1\times10^{20}/cm^3$ to $1\times10^{22}/cm^3$;
a gate electrode formed on said gate insulation film; and
an ohmic electrode provided for the n-channel MISFET and the p-channel MISFET, the ohmic electrode being formed by heat treatment in an inert atmosphere containing hydrogen at a temperature in a range of 800° C. to 1000° C.

2. A DMIS device, comprising:
a first-conductive-type silicon carbide substrate having a (000-1) face or a face inclined from the (000-1) face;
a first-conductive-type silicon carbide layer formed on said substrate;
a second-conductive-type well region formed in said first-conductive-type silicon carbide layer;
impurity regions formed in said well region to form a first-conductive-type source region and a second-conductive-type contact region;
a gate insulation film containing $1\times10^{19}/cm^3$ to $1\times10^{22}/cm^3$ of hydrogen formed on the impurity regions in said well region, the second-conductive-type well region and said first-conductive-type silicon carbide layer or on the second-conductive-type well region and said first-conductive-type silicon carbide layer or on the second-conductive-type well region, wherein a hydrogen content in an interface between the gate insulation film and the first-conductive-type silicon carbide layer is $1\times10^{20}/cm^3$ to $1\times10^{22}/cm^3$;
a gate electrode formed on said gate insulation film;
an ohmic electrode formed on a surface of said source region and said contact region by heat treatment in an inert atmosphere containing hydrogen at a temperature in a range of 800° C. to 1000° C.; and
an ohmic electrode formed on a (0001) face on a back side of said substrate by heat treatment in an inert atmosphere containing hydrogen at a temperature in a range of 800° C. to 1000° C.

3. A lateral resurf MISFET, comprising:
a semiconductor silicon carbide substrate having a (000-1) face or a face inclined from the (000-1) face;
a first-conductive-type silicon carbide layer formed on said substrate;
second-conductive-type impurity regions formed in said silicon carbide layer to form a resurf region, a source region and a drain region;
a gate insulation film containing $1\times10^{19}/cm^3$ to $1\times10^{22}/cm^3$ of hydrogen formed on the first-conductive-type silicon carbide layer or on the first-conductive-type silicon carbide layer with a second-conductive-type impurity region, wherein a hydrogen content in an interface between the gate insulation film and the second-conductive-type impurity region is $1\times10^{20}/cm^3$ to $1\times10^{22}/cm^3$;

a gate electrode formed on said gate insulation film; and
an ohmic electrode formed on a surface of said source region and said drain region by heat treatment in an inert atmosphere containing hydrogen at a temperature in a range of 800° C. to 1000° C.

4. An IGBT device, comprising:
a first-conductive-type silicon carbide substrate having a (000-1) face or a face inclined from the (000-1) face;
a second-conductive-type silicon carbide layer formed on said silicon carbide substrate;
a first-conductive-type well region formed in said second-conductive-type silicon carbide layer;
impurity regions formed in said well region to form a second-conductive-type source region and a first-conductive-type contact region;
a gate insulation film containing $1\times10^{19}/cm^3$ to $1\times10^{22}/cm^3$ of hydrogen formed on said impurity regions formed in said well region, said first-conductive-type well region and said second-conductive-type silicon carbide layer or on the said first-conductive-type well region and said second-conductive-type silicon carbide layer or on the said first-conductive-type well region, wherein a hydrogen content in an interface between the gate insulation film and the second-conductive-type silicon carbide layer is $1\times10^{20}/cm^3$ to $1\times10^{22}/cm^3$;
a gate electrode formed on said gate insulation film;
an ohmic electrode formed on said source region by heat treatment in an inert atmosphere containing hydrogen at a temperature in a range of 800° C. to 1000° C.; and
an ohmic electrode formed on a (0001) face on a back side of the substrate by heat treatment in an inert atmosphere containing hydrogen at a temperature in a range of 800° C. to 1000° C.

5. A method of manufacturing a CMIS device comprising the steps of:
forming a first-conductive-type silicon carbide layer on a substrate having a (000-1) face or a face inclined from the (000-1) face;
forming a high concentration impurity region in said first-conductive-type silicon carbide layer to provide an n-channel MISFET and a p-channel MISFET;
forming a gate insulation film containing $1\times10^{19}/cm^3$ to $1\times10^{22}/cm^3$ of hydrogen or hydroxyl group (OH) on the first-conductive-type silicon carbide layer or on the first-conductive-type silicon carbide layer with a high concentration impurity region;
forming a gate electrode on said gate insulation film; and
forming an ohmic electrode provided for the n-channel MISFET and the p-channel MISFET by heat treatment in an inert atmosphere containing hydrogen at a temperature in a range of 800° C. to 1000° C.

6. A method of manufacturing a DMIS device comprising the steps of:
forming a first-conductive-type silicon carbide layer on a first-conductive-type silicon carbide substrate having a (000-1) face or a face inclined from the (000-1) face;
forming a second-conductive-type well region in said first-conductive-type silicon carbide layer;
forming impurity regions in said well region thereby forming a first-conductive-type source region and a second-conductive-type contact region;
forming a gate insulation film containing $1\times10^{19}/cm^3$ to $1\times10^{22}/cm^3$ of hydrogen or hydroxyl group (OH) on the impurity regions in said well region, the second-conductive-type well region and said first-conductive-type silicon carbide layer or on the second-conductive-type well region and said first-conductive-type silicon carbide layer or on the second-conductive-type well region;
forming a gate electrode on said gate insulation film;
forming an ohmic electrode on a surface of said source region and said contact region by heat treatment in an inert atmosphere containing hydrogen at a temperature in a range of 800° C. to 1000° C.; and
forming an ohmic electrode on a (0001) face on a back side of said substrate by heat treatment in an inert atmosphere containing hydrogen at a temperature in a range of 800° C. to 1000° C.

7. A method of manufacturing a lateral resurf MISFET comprising the steps of:
forming a first-conductive-type silicon carbide layer on a semiconductor silicon carbide substrate having a (000-1) face or a face inclined from the (000-1) face;
forming second-conductive-type impurity regions in said silicon carbide layer to form a resurf region, a source region and a drain region;
forming a gate insulation film containing $1\times10^{19}/cm^3$ to $1\times10^{22}/cm^3$ of hydrogen or hydroxyl group (OH) on the first-conductive-type silicon carbide layer or on the first-conductive-type silicon carbide layer with a second-conductive-type impurity region;
forming a gate electrode on said gate insulation film; and
forming an ohmic electrode on a surface of said source region and said drain region by heat treatment in an inert atmosphere containing hydrogen at a temperature in a range of 800° C. to 1000° C.

8. A method of manufacturing an IGBT device comprising the steps of:
forming a second-conductive-type silicon carbide layer on a first-conductive-type silicon carbide substrate having a (000-1) face or a face inclined from the (000-1) face;
forming a first-conductive-type well region in said second-conductive-type silicon carbide layer;
forming impurity regions in said well region to form a second-conductive-type source region and a first-conductive-type contact region;
forming a gate insulation film containing $1\times10^{19}/cm^3$ to $1\times10^{22}/cm^3$ of hydrogen or hydroxyl group (OH) on said impurity regions in said well region, said first-conductive-type well region and said second-conductive-type silicon carbide layer or on the said first-conductive-type well region and said second-conductive-type silicon carbide layer or on the said first-conductive-type well region;
forming a gate electrode on said gate insulation film;
forming an ohmic electrode on said source region by heat treatment in an inert atmosphere containing hydrogen at a temperature in a range of 800° C. to 1000° C.; and
forming an ohmic electrode on a (0001) face on a back side of the substrate by heat treatment in an inert atmosphere containing hydrogen at a temperature in a range of 800° C. to 1000° C.

* * * * *